(12) United States Patent
Beltran et al.

(10) Patent No.: US 11,018,641 B2
(45) Date of Patent: May 25, 2021

(54) POWER COMBINER CIRCUIT

(71) Applicant: OPHIR RF, INC., Los Angeles, CA (US)

(72) Inventors: Ramon A. Beltran, San Diego, CA (US); Feiyu Wang, San Gabriel, CA (US); Gregorio Villagrana, Norwalk, CA (US)

(73) Assignee: OPHIR RF, INC., Los Angeles, CA (US)

( * ) Notice: Subject to any disclaimer, the term of this patent is extended or adjusted under 35 U.S.C. 154(b) by 73 days.

(21) Appl. No.: 16/531,058

(22) Filed: Aug. 3, 2019

(65) Prior Publication Data
US 2021/0036673 A1    Feb. 4, 2021

(51) Int. Cl.
| | |
|---|---|
| H03F 3/60 | (2006.01) |
| H03F 3/21 | (2006.01) |
| H03H 7/46 | (2006.01) |
| H01P 5/10 | (2006.01) |
| H03H 7/38 | (2006.01) |
| H01P 3/06 | (2006.01) |

(52) U.S. Cl.
CPC .............. *H03F 3/60* (2013.01); *H01P 3/06* (2013.01); *H01P 5/10* (2013.01); *H03F 3/21* (2013.01); *H03H 7/38* (2013.01); *H03H 7/463* (2013.01)

(58) Field of Classification Search
CPC .... H03F 3/60; H03F 3/21; H03H 7/38; H03H 7/463; H01P 3/06; H01P 5/10
USPC ........................................................ 333/124
See application file for complete search history.

(56) References Cited

U.S. PATENT DOCUMENTS

| 6,844,793 B2 * | 1/2005 | Kenington | ............ H03F 1/0288 |
| | | | 333/101 |
| 2003/0117231 A1 * | 6/2003 | Gerlock | ................... H03H 7/48 |
| | | | 333/124 |

* cited by examiner

*Primary Examiner* — Robert J Pascal
*Assistant Examiner* — Kimberly E Glenn
(74) *Attorney, Agent, or Firm* — Lazaris IP (57) ABSTRACT

A power combiner circuit comprises a network topology for broadband RF and microwave systems that includes coupling elements, internodal matching sections, and an output matching section. The network topology serves as a combining mechanism for power from multiple power amplifiers. The network topology is designed so that characteristic impedances of transmissions lines serving as the coupling elements, internodal matching sections, and an output matching section produce a load impedance at an output port that is matched to the impedances seen by each power amplifier providing power to the power combiner circuit. Such a network topology is scalable to an unlimited number of power amplifiers, and enables a desired broadband frequency response for power amplification, while realizing a very low level of power output loss between input and output ports.

33 Claims, 7 Drawing Sheets

POWER COMBINER CIRCUIT

FIELD OF THE INVENTION

The present invention relates to radio frequency and microwave power electronics systems. Specifically, the present invention relates to a power combiner circuit that is not constrained as to the number of ports, and exhibits very low power loss in combining power amplifier systems as well as performance increases for use in wide-bandwidth or broadband applications.

BACKGROUND OF THE INVENTION

Power combiner circuits are commonly used to combine signals from multiple power amplifiers and other integrated circuits in electronic circuit design. A combiner circuit combines a plurality of signals into a common signal. Conversely, dividers are circuits that divide a signal into a plurality of signals. An n-way combiner therefore combines n signals into a single, common signal, while an n-way divider divides a single signal into n signals. Therefore, it should be noted that the same circuit can be a combiner or divider, depending on the direction of current flow, or alternatively whether the common or single signal is at the input port or at the output port. Existing combiner circuits may often be referred to as either combiners, dividers, combiners/dividers, or other similar nomenclature.

Power combiner circuits generally operate by introducing a characteristic impedance along transmission lines or pathways. A characteristic impedance is a measure of balance between opposing a change in current (inductance) and opposing a chance in voltage (capacitance). Transmission lines are the pathways along which current and voltage flow through a circuit, and can have many configurations in power combiner circuits in which a characteristic impedance is introduced, such as coaxial cables, waveguides, and lumped-element components such as capacitors, inductors, and resistors.

There are many existing types of power combiner circuits. One commonly-used design is known as a Wilkinson power combiner. The Wilkinson topology at its simplest level typically includes an isolation resistor between power inputs that allows for combining (or dividing) input signals to provide an in-phase output signal, but is not suitable for many uses, in part because of a limited bandwidth capacity due to the use of quarter wavelength transmission lines. The Wilkinson topology also results in substantial power output dissipation between input and output ports when higher bandwidth capacity is achieved due to the use of multiple quarter wavelength transmission lines. If only one pair of quarter wavelength transmission lines are used, the bandwidth is limited to typically 30% of the design frequency, multiple pairs increase the bandwidth but also increase the power output dissipation.

Another existing type of power combiner circuit is known as a Darwish combiner. These prior art combiners require 45° transmission lines connected in series from each power amplifier branch in order to achieve their desired reflection cancellation effect. This limits its achievable frequency bandwidth however, since no multiple sections can be used. Additionally, a Darwish combiner does not allow for the load impedance at the output port to be matched to the impedance seen at the input ports, which leads to unwanted amplifier behavior when the network is used as a combiner. The unwanted behavior can be manifested as unstable amplifier operation, loss in output power, overheating, and eventually amplifier (transistor) destruction.

When designing a power combiner circuit, many performance characteristics that need to be considered. The broadband capacity of many power combining schemes is limited due at least in part to practical considerations in transmission line length and power dissipation that inhibit a high-frequency response. Efficiency is also a concern when implementing a power combining scheme, as maintaining low power loss when routing input signals in a combiner is an important design characteristic. For example, if 1 dB of response loss is experienced in each stage, by the time the design is scaled to a three-stage combiner, substantial output power has been lost.

Accordingly, there is a need for improvements in the design and performance of existing power combiner circuits that allow for high bandwidth performance at a desired frequency response, and at the same time reductions in losses suffered in power output. There is a further need in the art for a power combiner that can be scaled to unlimited number n input ports that still provides for broadband performance and minimal losses in power throughput.

BRIEF SUMMARY OF THE INVENTION

It is therefore one objective of the present invention to provide a circuit for combining inputs from power amplifiers in which the load impedance at an output port is matched to the characteristic impedance seen by each input port. It is another objective of the present invention to provide a power combiner circuit in which a matched impedance condition is simultaneously achieved across an entire network topology. It is still another objective to provide a power combiner circuit which exhibits such a matched impedance between input and output ports, and which is applicable and expandable to an unlimited number of power amplifier input circuits. It is still another objective to provide a power combiner circuit which experiences a very low return loss between input ports and the output port, regardless of the number of such power amplifier input circuits. It is still a further objective of the present invention to provide a power combiner circuit in which the impedances of transmission can be calculated for operation between particular frequencies for desired bandwidth and attain reliable broadband performance.

The present invention provides a design for a power combiner circuit, in which input signals are combined in an impedance matching network topology that ensures that a load impedance seen at an output of the circuit is the same as the impedances seen by each input port, regardless of the number of circuits providing the input signals at those input ports. The network topology includes several components that each introduce a characteristic impedance so that signals passing through transmission lines see impedances that are calculated to ensure the matched condition at the output port. In this regard, the present invention may be considered as an n-way power combiner, as the present design is agnostic as to the number of input ports. The network topology also ensures that as combined power increases at different nodes throughout the combiner circuit, power insertion loss decreases along the way towards the output port, so that the insertion loss is distributed.

As noted herein, the design examples presented below illustrate a four-way combiner. Nevertheless, the number of input ports can be extended to n ports, where n could be any integer, i.e.: n=1, 2, 3, etc., and it is to be understood that the design is not to be constrained to any number of ports, nor it is to be constrained as in a conventional corporate combiner where the number of inputs have to be an even number forced to combine in amplifier pairs. Additionally, although the design example presented below explores a combining technique for load impedances of 50 ohms, other impedances are possible, and the present invention is not to be limited to any one load impedance mentioned or described herein.

In the power combiner circuit design of the present invention, characteristic impedances of transmission lines in its network topology are calculated so that the load impedance at the output port ($R_O$) is matched to whatever impedance the designer intends for inputs from power amplifiers to see according to the desired bandwidth operation. In other words, the impedance matching condition of the network topology comprising the power combiner circuit of the present invention can be specifically calculated for broadband performance, regardless of the number of input ports, and without having to worry about power losses that produce unwanted amplifier behavior.

It is to be further noted that one major difference between the technique of the present invention, and that of a typical or commercially-available distributed amplifier combiner circuit, relies on the fact that the power combiner circuit described herein does not reproduce an artificial transmission line or low-pass filter incorporating the parasitic capacitances of active devices such as a field-effect transistor, or FET. Instead, no knowledge of the amplifier characteristics is necessary for the power combiner circuit to perform as expected, except their required load impedances at input and output ports for the desired performance. The power combiner circuit may therefore combine any other RF or microwave components that match the characteristic impedances at input ports, which is not the case for existing distributed amplifier input/output combiners.

There are many benefits to be realized by the design of the present invention. For example, an improved frequency response is possible due to the simultaneous "four-stage" (or, n-stage) matching and combining, where each power amplifier branch represents a matching stage, as well as one combiner port. Also, insertion loss is reduced, as compared to a conventional corporate or commercially-available power combiner. In the four-stage example, the output signal of first power amplifier travels all the way to the load; however, this is only one quarter of the total combined output power in such a four-stage design. As combined power increases at different nodes along the way to the output port, the insertion loss decreases along the way towards the output port (output load $R_O$), and so the fourth power amplifier sees less insertion loss than all other power amplifiers, so that the insertion loss is therefore "distributed". In contrast, in a conventional four-input power combiner, all amplifier output signals see the same branched insertion loss.

Other objects, embodiments, features and advantages of the present invention will become apparent from the following description of the embodiments, taken together with the accompanying drawings, which illustrate, by way of example, the principles of the invention.

BRIEF DESCRIPTION OF THE SEVERAL VIEWS OF THE DRAWINGS

The accompanying drawings, which are incorporated in and constitute a part of this specification, illustrate several embodiments of the invention and together with the description, serve to explain the principles of the invention.

DETAILED DESCRIPTION OF THE INVENTION

In the following description of the present invention reference is made to the exemplary embodiments illustrating the principles of the present invention and how it is practiced. Other embodiments will be utilized to practice the present invention and structural and functional changes will be made thereto without departing from the scope of the present invention.

Figure 1:
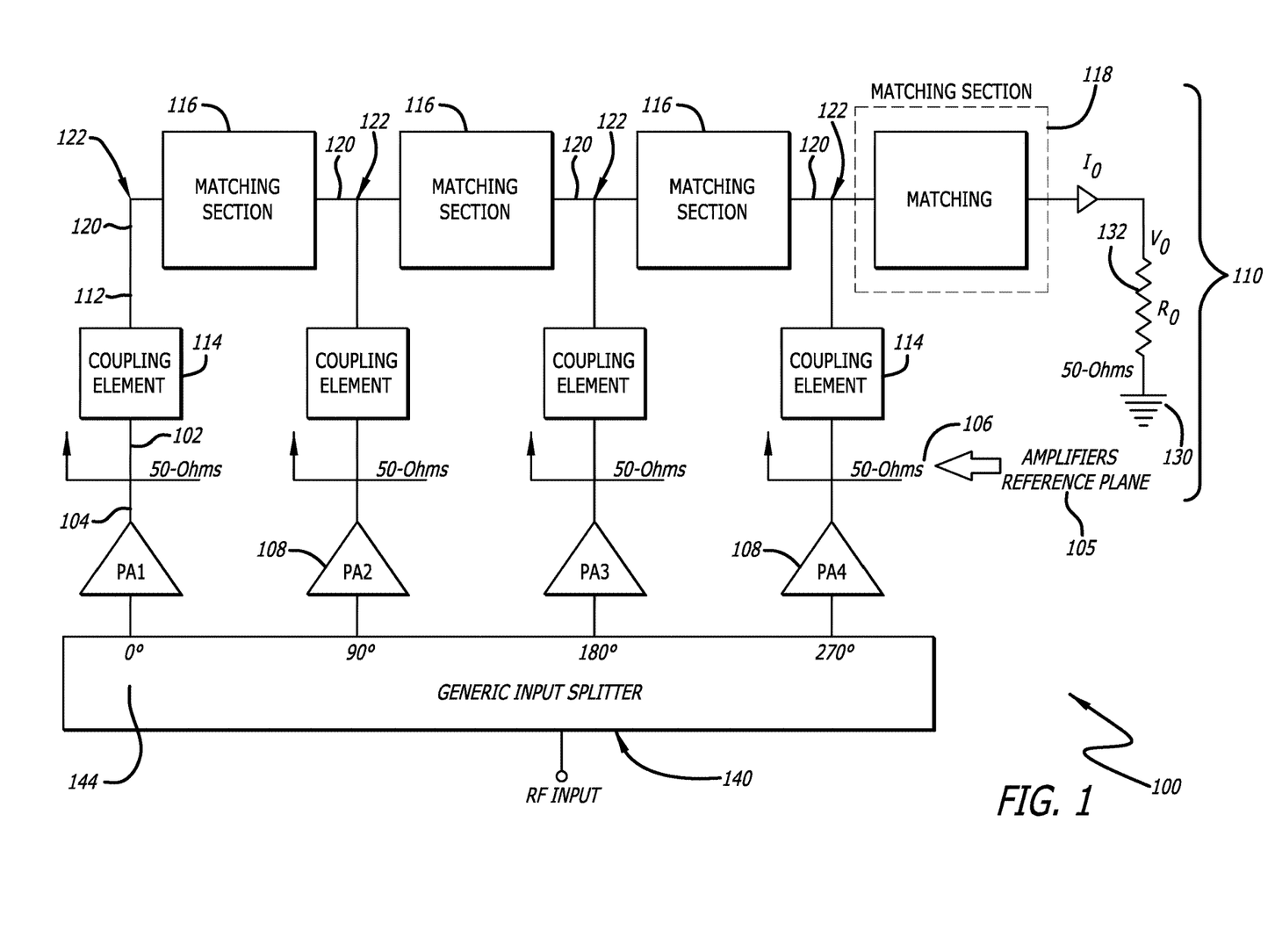
FIG. 1 is a circuit diagram for a power combiner circuit according to the present invention.

FIG. 1 is a circuit diagram of a power combiner circuit 100 according to the present invention, for power applications in radio frequency and microwave circuit design. In the power combiner circuit 100 described herein, input signals 104 are combined in an impedance matching network topology 110 that ensures that a load impedance 132 seen at an output port 130 is the same as the impedances 106 seen by each incoming input signal 104 at each input port 102. The power combiner circuit 100 includes several components that introduce a characteristic impedance in transmission lines 112, each of which contribute to enabling a matched impedance condition in the network topology 110 regardless of the number of input circuits providing the input signals 104. In this regard, the present invention may be considered as an n-way power combiner.

The power combiner circuit 100 receives an input signal 104 at each input port 102. The power combiner circuit 100 is configured to combine the power outputs of one or more power amplifier circuits 108 to enable those power outputs to be used by a further circuit(s) in radio frequency and microwave applications. The input signals 104 are therefore outputs provided by those power amplifier circuits 108, which may for example be monolithic microwave integrated circuits (MMICs) or any other circuit designed to perform functions in such applications, such as microwave mixing, power amplification, low-noise amplification, and high-frequency switching.

Power amplifiers 108 such as MMICs are frequently designed for a characteristic impedance of 50 ohms, and therefore for exemplary purposes, the present invention may refer to a reference impedance at both the amplifier reference plane 105 and the load of 50 ohms. However, it is to be understood that the design of the present invention is applicable for any desired characteristic impedance seen at the input ports 102 or the output port 130, and that the load impedance 132 and impedances 106 seen at the input ports 102 may be of any value, depending on the design and performance characteristics. Therefore the present invention is not to be limited to any specific reference or load impedance mentioned herein.

The network topology 110 of the power combiner circuit 100 of the present invention includes multiple elements that are designed to produce the matched impedance condition noted above, for the desired performance characteristics. The network topology 110 is comprised of a plurality of transmission lines 112 along which current flows from input ports 102 to the output port 130. Each transmission line 112 includes an impedance inverter 150 configured to introduce a characteristic impedance seen by the input signals 104 as they pass through the network topology 110.

Transmission lines 112 may be of any type, and of any electrical length. In one embodiment of the present invention, the transmission lines 112 have an electrical length of approximately 90° at center frequency, representing a quarter wavelength. Designing the network topology 110 so that all of the transmission lines 112 have the same or similar electrical length allows broadband performance to be set by different characteristic impedance values of the transmission lines 112.

It is to be noted that transmission lines 112 are structures that serve as electrically-conductive pathways for current to pass between circuit elements, and that many types of transmission lines 112 are commonly used in circuit design. It is to be understood therefore that the present invention contemplates that the transmission lines 112 may include any specific type of impedance inverter 150. For example, lumped-element equivalent circuits may be used to introduce the characteristic impedance, such as an LC pi-network or an LC T network. Still other embodiments are possible, for example where an impedance inverter 150 is in the form of microstrip, stripline, or slotline transmission lines, and where waveguides are used for introducing the characteristic impedance Returning to FIG. 1, the network topology 110 includes a plurality of coupling elements 114 that are each configured between the input ports 102 and receiving nodes 122 of a cascaded array of nodes 120. These coupling elements 114 provide the initial characteristic impedance seen by the input signals 104 entering the power combiner circuit 100 from the power amplifiers 108 or other integrated circuits providing signals for which power is to be combined. The network topology 110 further includes a plurality of matching sections 116 each configured between a receiving node 122, so that the coupling elements 114 and the internodal matching sections 116 are coupled in series relative to each input port 102 and the output port 130 (with the exception of the final or n-th input port 102 in the overall power combiner circuit 100). Each of these internodal matching sections 116 therefore provides a further characteristic impedance seen by current arriving its preceding receiving node 122.

The network topology 110 also includes an output matching section 118 coupling between the final receiving node 122 and the output port 130. The output matching section 118 may be comprised of more than one transmission line 112, and more than one impedance inverter 150, to introduce additional impedance seen by the sum of the currents flowing between the input ports 120 and the output port 130.

Figure 2:
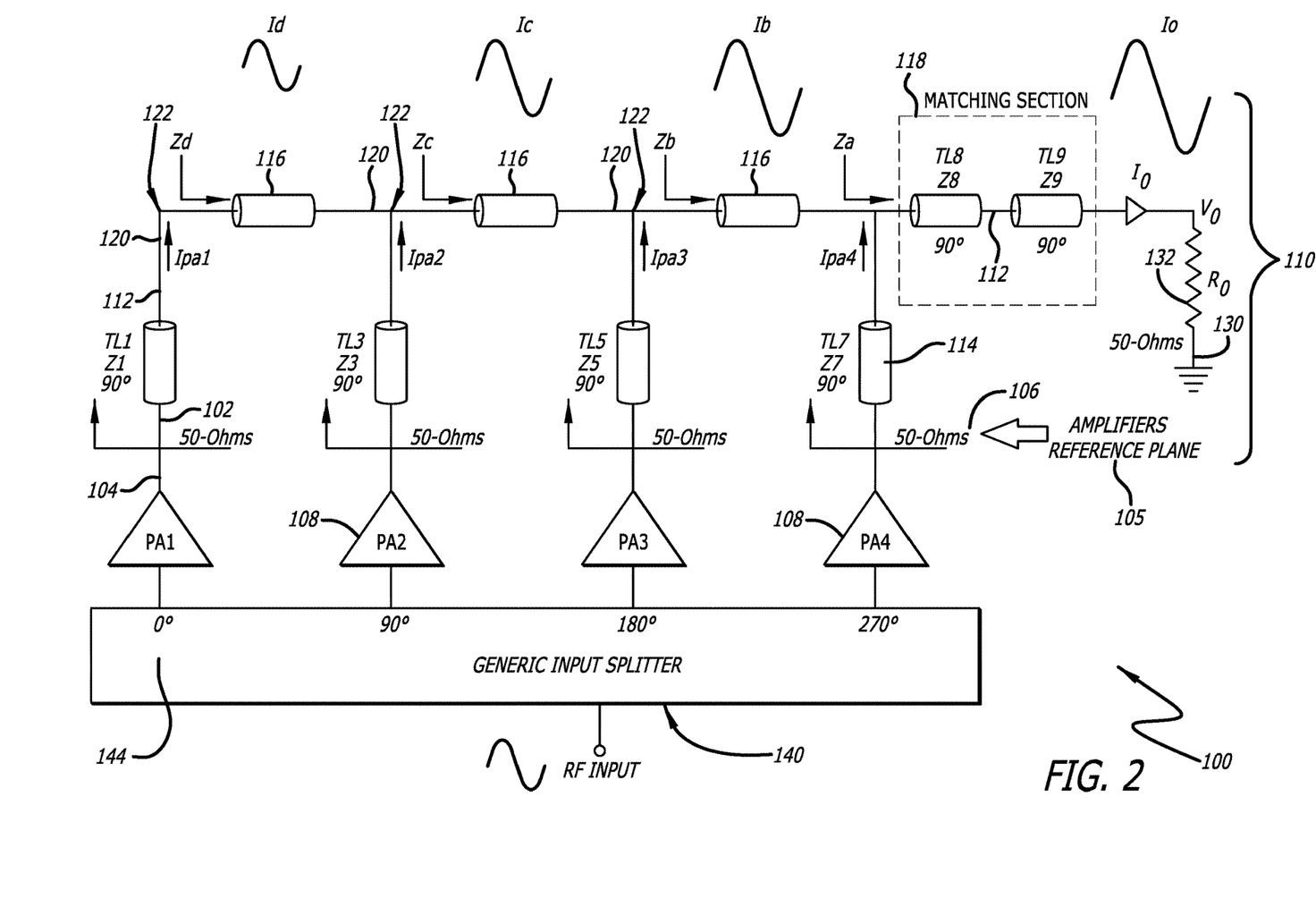
FIG. 2 is a circuit diagram for a power combiner circuit according to one embodiment of the present invention.

FIG. 1 shows the elements of the network topology 110 as blocks, or black boxes, in the power combiner circuit 100. FIG. 2 is a further diagram of the power combiner circuit 100 in which the blocks comprising the network topology 110 are shown as transmission lines 112 (shown as TL1-TL9) each having an electrical length of 90°.

FIG. 1 and FIG. 2 are therefore design examples of a four-way power combiner circuit 100. Describing the power combiner circuit 100 from the load at the output port 130, $R_O$ (50-Ohms) to the amplifier reference plane 105, and referring to FIG. 1 and FIG. 2, transmission lines 112 with the notation TL8 and TL9 serve as impedance inverters 150 in the output matching section 118. As noted herein, TL8 and TL9 (and, all transmission lines 112) may comprise any other type of impedance element and therefore the network topology 110 may have many different configurations of circuit elements, such as for example lumped-element equivalent circuits (comprised of capacitors, inductors, or resistors) 152, microstrip transmission lines 154, coaxial transmission lines 156, and waveguides 158. Still other configurations are possible, for example stripline transmission lines and slotline transmission lines.

Regardless of the configuration of the network topology 110, TL7 combines the output of the last/fourth power amplifier (PA4). Its impedance Z7 is calculated (or adjusted) to present 50 ohms to power amplifier PA4 together with TL8 and TL9, given the impedance generated at the receiving node $Z_a$ that is affected by current $I_b$, which is about three times the current provided by power amplifier PA4 to the same node $Z_a$, assuming all power amplifiers 108 deliver same current with the same phase at the respective receiving nodes.

The current $I_b$ is generated by the sum of $I_d$ and $I_c$;

$$I_b = I_c + I_d$$

Where is the sum of the current from second power amplifier (PA2) and the current of the first power amplifier (PA1), which are of the same amplitude, and enter node $Z_c$. $I_d$ is the same as the current of power amplifier PA1:

$$I_d = I_{pa}1$$

$$I_c = I_{pa}1 + I_{pa}2$$

The output current $I_a$ seen at the output port 130 is the sum of the output currents of all power amplifiers 108. The required impedances can be then calculated at each receiving node (designated in FIG. 2 as $Z_a$, $Z_b$, $Z_c$ and $Z_d$).

Where the power combiner circuit 100 is implemented using generic transmission lines 112 as in FIG. 2, the transmission-line impedances may be calculated with explicit equations at the fundamental frequency. Where the n-way power combiner circuit 100 is implemented to combine power outputs of four power amplifiers 108, the impedances are calculated as follows.

Since the impedances 106 seen by the outputs of the power amplifiers 108 are desired at 50 ohms, the characteristic impedances of the coupling elements 114 identified as TL1, TL3, TL5 and TL7 must be 50 ohms, and therefore $$Z_1 = Z_3 = Z_5 = Z_7 = 50 \text{ ohms}$$

As noted above, the present invention contemplates that other impedances (other than 50 ohms) may be used, but in this example, a 50-ohm load impedance 132 design is used.

Consequently, the characteristic impedance at the first transmission line 112, identified as TL2, must match the impedance value of the transmission line 112 (identified by TL1):

$$Z_2 = Z_1 = 50 \text{ ohms}$$

The values of the characteristic impedance at transmission lines 112 represented by TL4 and TL6 are then:

$$Z_4 = Z_1/2 = 25 \text{ ohms}$$

$$Z_6 = Z_1/3 = 16.66 \text{ ohms},$$

Since the impedance looking into the node $Z_a$ must be:

$$Z_a = Z_1/4 = 12.5 \text{ ohms}$$

The output matching section 118 must provide impedance matching from a 50-ohm load impedance $R_o$ 132 at the output port 130 of the power combiner circuit 100 down to an impedance at node $Z_a$ of 12.5 ohms. Transmission lines TL8 and TL9 therefore act as a matching component for the rest of the network topology 110.

Phasing Requirement

In the power combiner circuit 100 of the present invention, all currents from power amplifiers 108 must have proper phasing before they reach nodes $Z_c$, $Z_b$ and $Z_a$, so that they are added in-phase at those respective receiving nodes 122. To ensure proper phasing, the present invention may also include a phase-shifting component 140 at or prior to certain ones of the input ports 102, which may incorporate one or more elements 142 that change a transmission phase angle of incoming input signals 104 at input ports 102 to adjust the phase of those signals 104 so that all input signals 104 are in-phase.

Figure 4:
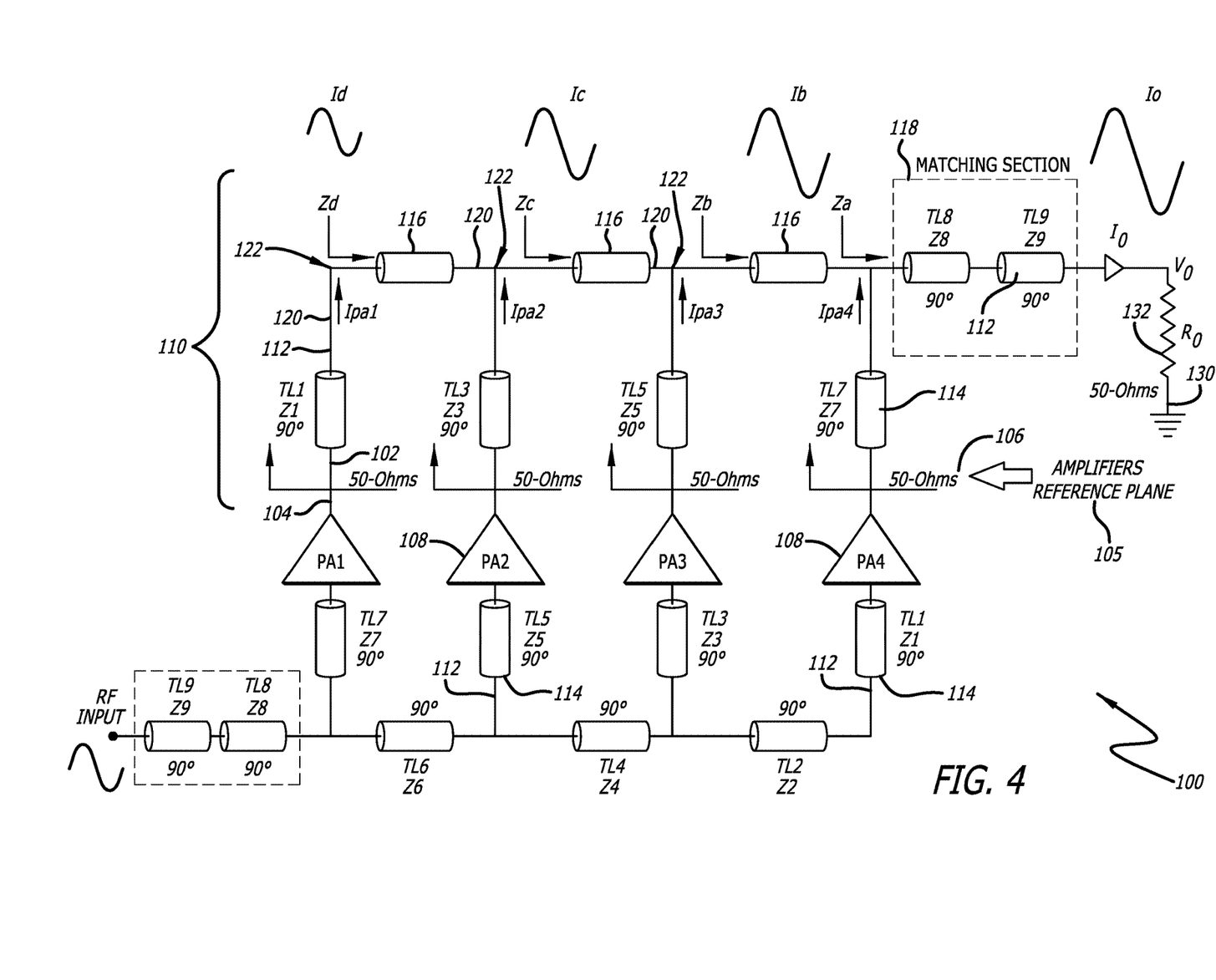
FIG. 4 is a circuit diagram for a power combiner circuit according to another embodiment of the present invention.

One type of phase-shifting component 140 for meeting the phasing requirement is an input splitter 144 represents a flipped mirrored image of the power combiner circuit 100, as shown in FIG. 4. Such an input splitter 144 may therefore include a network topology that has the same configuration as the impedance matching network topology 110.

Other phase-shifting components 140 are also possible, and are within the scope of the present invention. For example, the phase-shifting component 140 may comprise a phase shifter circuit coupled at one or more input ports 102. Such as phase shifter circuit acts as a delay element 142 for the power combiner circuit 100. In another example in which a delay element 142 is introduced, the phase-shifting component 140 may comprise a 90-degree hybrid coupler circuit coupled at one or more of the input ports 102. Similarly, any combination of phase-shifting components 140 may be incorporated in the present invention, so that input signals 104 have the same phase across all input ports 102. Further, the phase-shifting component 140 may comprise delay elements that provide a phase shift in either the time domain or the frequency domain, and it is to be understood that any type of circuit element which accomplishes a phase delay of an input signal 104 may be applied. Further, it is to be understood that the present invention is not to be limited to any one type of phase-shifting component 140 specifically discussed herein.

Figure 3:
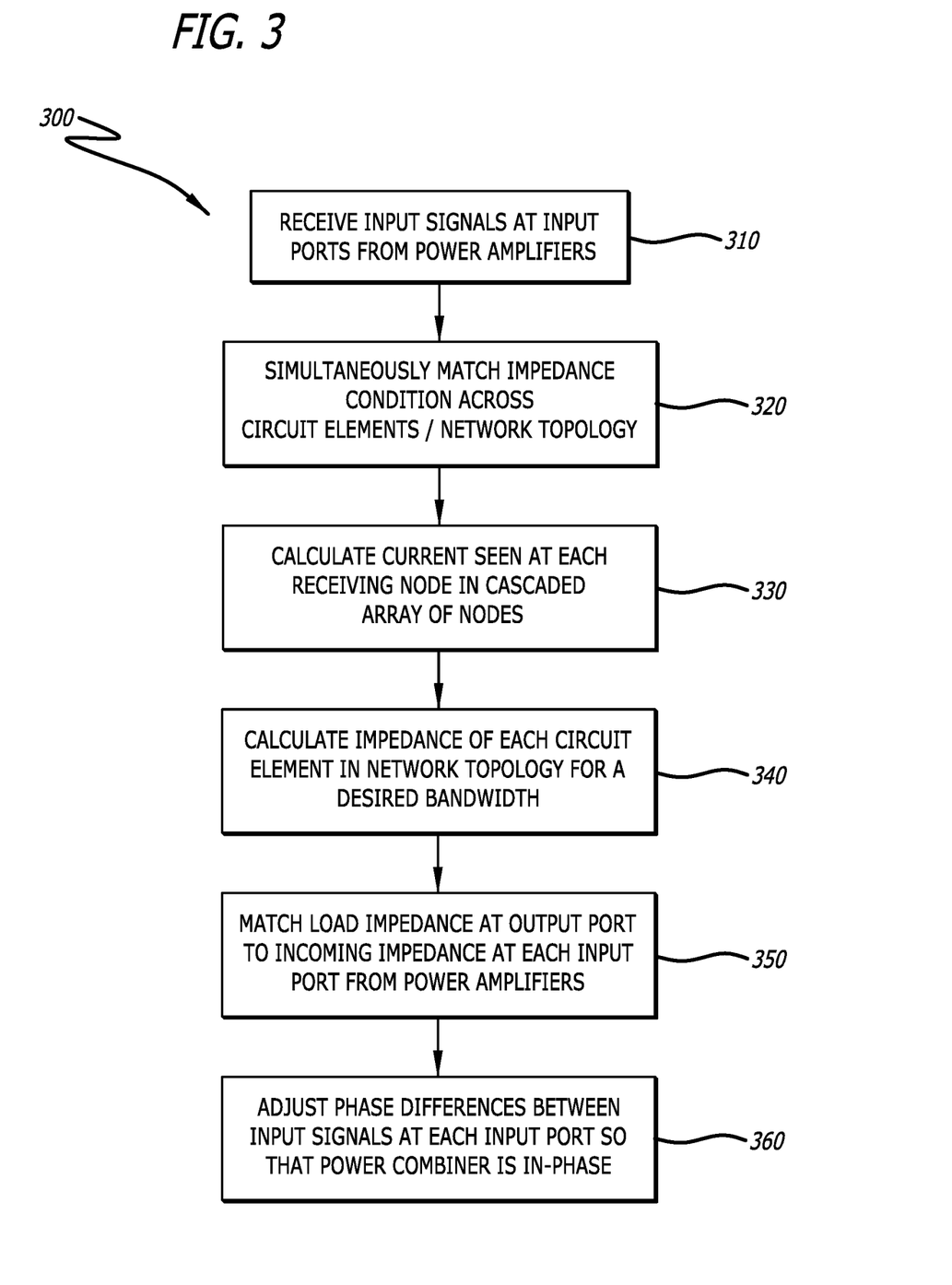
FIG. 3 is a flow chart illustrating steps in a process of matching input and output impedances in a power combiner circuit according to the present invention.

FIG. 3

FIG. 3 is a flowchart illustrating steps in a process 300 for designing and creating a matched impedance condition across a network topology 110 that allows for the load impedance 132 at the output port 130 to be the same as, or substantially the same as, the impedance 106 seen at each input port 102, according to certain embodiments of the present invention. Such a process 300 may include designing transmission lines 112 that each have an impedance value calculated with regard to the current in input signals 104 seen at each receiving node 122, so that the impedance of the network topology 110 has a simultaneously-matched condition between input ports 102 and the output port 130.

The process 300 begins by receiving, at step 310, a plurality of input signals 104 at input ports 102, generated as discussed above from integrated circuits such as power amplifiers 108. At step 320, these signals 104 are then sent through a plurality of transmission lines 112 in the network topology 110 each having an impedance characteristic. It is to be understood that the designer designs the network topology 110 and the impedance characteristics therein for specific operational performance, so that the load impedance 132 is the same as the impedances 106 of the amplifier reference plane 105. The impedance value of each component of the network topology 110 is therefore calculated with these design characteristics in mind, such as to achieve a desired bandwidth for a specific broadband frequency response, and so that a matched impedance condition is simultaneously achieved across all elements of the power combiner circuit 100.

This is accomplished by calculating, at step 330, the current seen at each receiving node 122. Once the current is known at each such receiving node 122, at step 340 the impedance values of each circuit element in the network topology 110 may then be calculated to realize the matched impedance condition between input ports 102 and the output port 130. In other words, and using the example of above, if the impedance inverters $Z_1$, $Z_3$ and $Z_5$ are each set to see an incoming impedance of 50 ohms from the power amplifiers 108, then the load impedance 132 at the output port 130 ($Z_7$) is also 50 ohms.

At step 360, design of the power combiner circuit 100 also accounts for differences in phases of incoming power amplifier outputs, by adjusting the input signals 104 seen at each input port 102. This ensures that the power combiner circuit 100 remains in-phase to minimize the negative impact on power output and performance of the power amplifiers 108 to which the power combiner circuit 100 is coupled. Introduction of a phase-shifting component 140 accomplishes this design objective, and any type of component that changes a transmission phase angle in one or more of the input signals 104 may be incorporated into the design of the power combiner circuit 100 to account for phase angle differences.

Broadband Performance

Where frequency operation at a high bandwidth is desired, other values of impedances $Z_1$-$Z_n$ may be selected, and infinite combinations of impedance values for the transmission lines $TL_1$-$TL_n$ are possible. In other words, if broadband performance is targeted, the impedances of the transmission lines $TL_1$ through $TL_n$ may be computed or optimized to enhance the frequency response.

Figure 5:
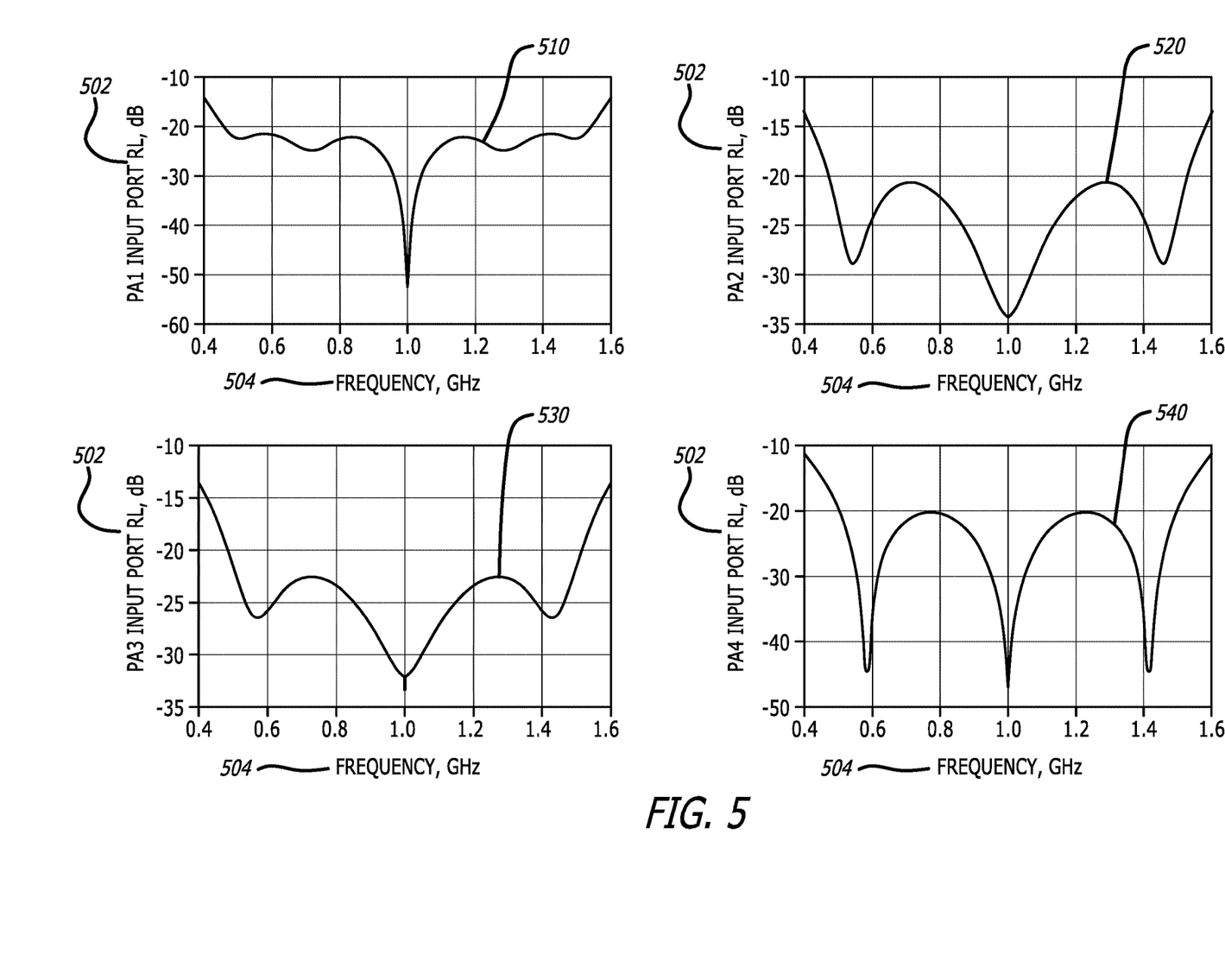
FIG. 5 is a graphical illustration plotting power transfer loss of the power combiner circuit for each power amplifier in an exemplary a four-way design according to the present invention.

The power combiner circuit 100 of the present invention is designed to perform in a wide frequency range, with an exemplary center frequency of $f_0$=1 GHz. An optimized frequency response 500 of the power combiner circuit 100 according to the present invention at such a center frequency is shown in FIG. 5, which shows frequency response plots 510, 520, 530 and 540 for each power amplifier 108 in an exemplary four-way power combiner circuit 100. Each plot shows a response loss 502 plotted against a frequency 504 for each power amplifier 108.

The achievable bandwidth shown in the optimized frequency response 500 is a two-octave bandwidth, and as can be seen in FIG. 5, the output ports of power amplifiers 108 (at the amplifier reference plane 105 from FIGS. 1, 2 and 4) present an return loss (RL) of −20 dB or better, from a frequency range of 0.5 GHz to 1.5 GHz. This performance indicates that the power combiner circuit 100 of the present invention provides an excellent match between input ports 102 and the output port 130, as it means that power transfer from one network to the other through the power combiner circuit 100 according to the present design is around 99%, so that almost all the power is transferred from the power amplifiers 108 to the output port 130. In other words, the transmission loss is 0.039-dB, which is very low. In addition to transmission response loss, as discussed below in further detail the insertion loss in the present invention is also reduced as compared to conventional power combiners, so that the design present invention realizes multiple performance advantages over existing designs.

It is to be noted that the achievable bandwidth may be a one, a two, a three or a four-octave bandwidth, depending on the number of sections of 90° transmission lines 112 and design needs, and therefore the present invention is not to be limited to any one bandwidth for broadband performance described herein. Further, though it is assumed that the power amplifiers 108 are matched to 50 ohms (referring to the example from above) and that the present invention operates under a load impedance 132 of 50 ohms, as noted above the present invention may also designed for any other impedance value seen at input ports 102 and the output port 130, and that these characteristic impedance values of the network topology 110 may be calculated according to the desired bandwidth or for the desired broadband performance.

Figure 6:
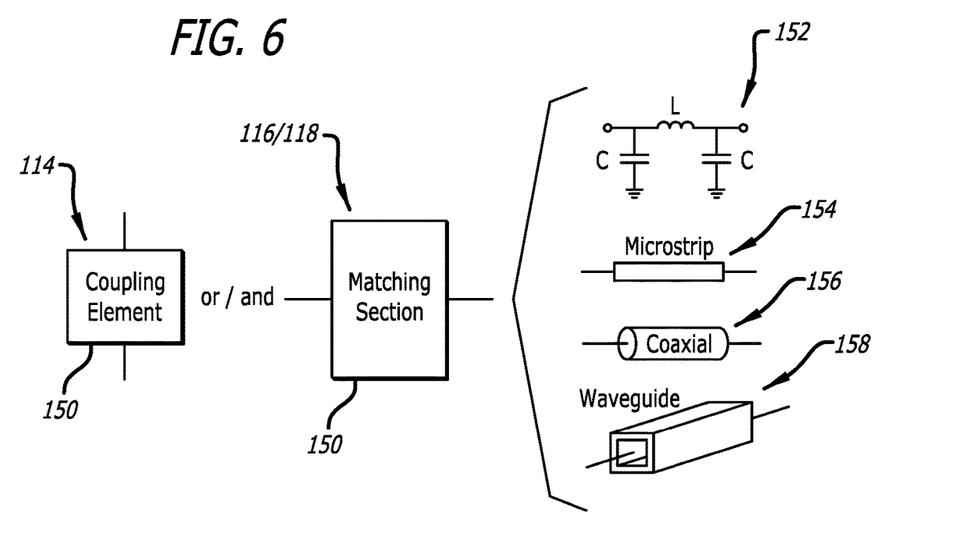
FIG. 6 is a diagram of components of a power combiner circuit to different aspects of the present invention.
Figure 7:
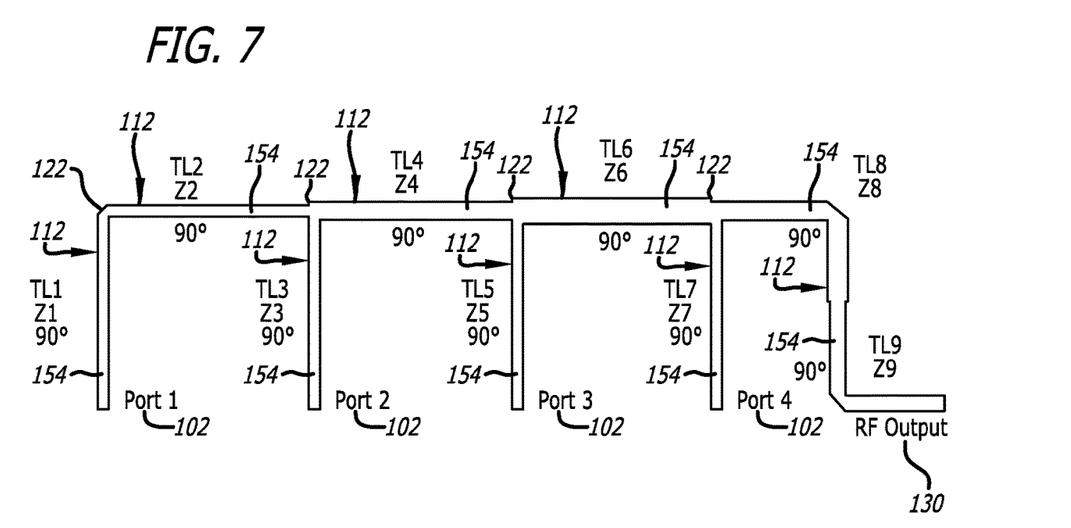
FIG. 7 is a diagram of a printed circuit board showing an alternative topological configuration for the power combiner circuit of FIG. 2.
Figure 8:
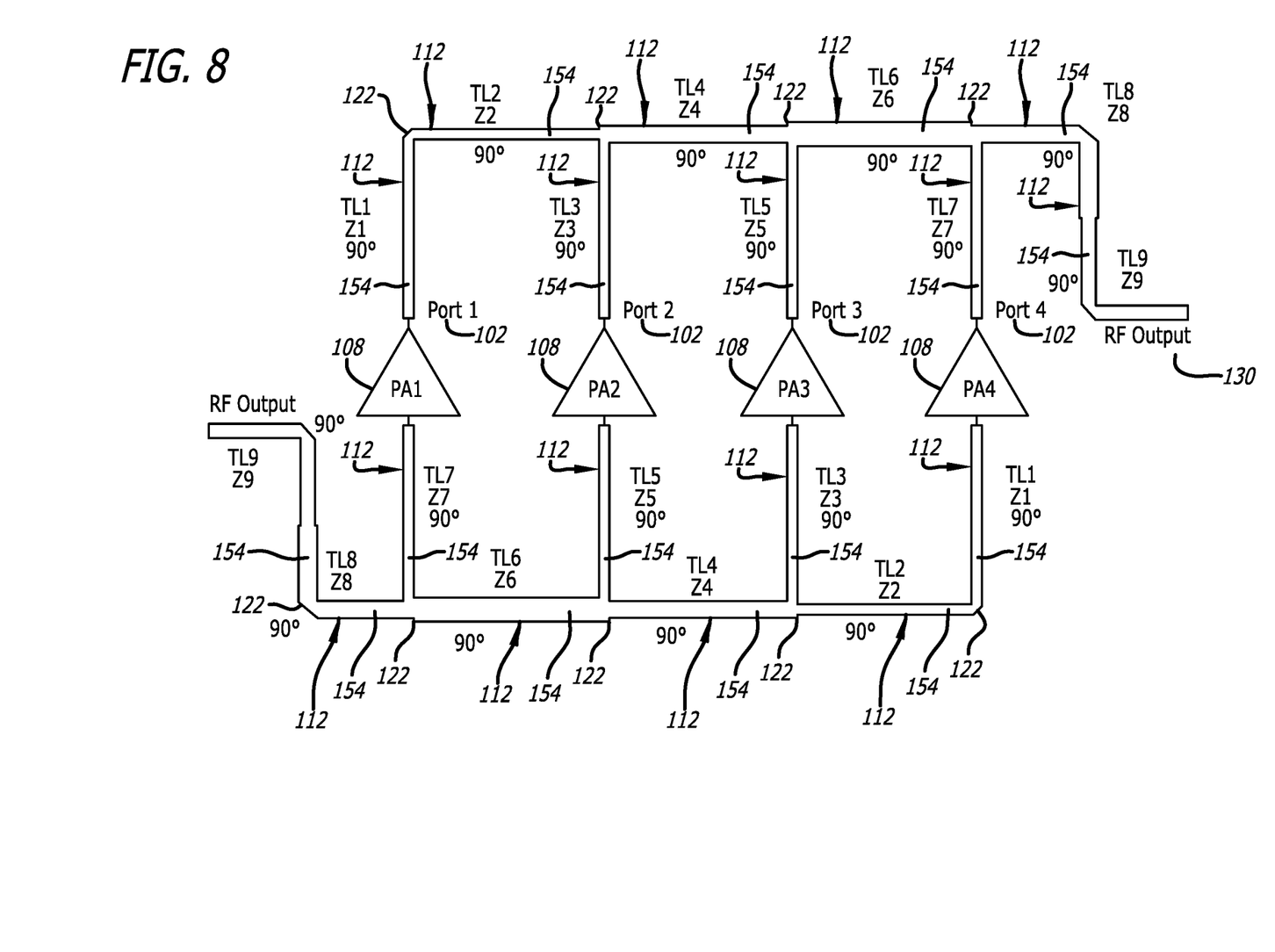
FIG. 8 is a diagram of a printed circuit board showing an alternative topological configuration for the power combiner circuit of FIG. 4.

FIGS. 6-8

FIG. 6 is a diagram of components of a power combiner circuit 100 according to a different aspect of the present invention. As noted above, the coupling elements 114, the internodal matching sections 116, and the output matching sections 118 may be comprised of different components and circuit elements, each of which may be configured to provide the desired impedance seen by the current as it passes through the network topology 100. Many different configurations of such a network topology 110, and therefore many embodiments of the present invention may be configured depending on the type impedance inverter 150 used.

For example, the network topology 100 may include a lumped-element equivalent circuit 152 such as capacitors, inductors, resistors, and combinations of such components. The network topology 100 may alternatively include microstrip transmission lines 154. Microstrip is a well-known transmission line format used to introduce a characteristic impedance in circuit design. Use of microstrip transmission lines 154 are shown in further detail in FIG. 7 and FIG. 8, and discussed further below. Additional configurations of the present invention are possible, for example, where the network topology 110 includes coaxial transmission lines 156, or waveguides 158.

FIG. 7 is a diagram of a printed circuit board showing an alternative topological configuration using microstrip transmission lines 154 for the power combiner circuit 100 of FIG. 2. FIG. 8 is a diagram of a printed circuit board showing microstrip transmission lines 154 in the configuration of the power combiner circuit 100 of FIG. 4, with power amplifiers 108 and an input splitter 144 representing a flipped mirrored image of the network topology 110. Microstrips have a structure generally comprised of a single ground plane, a conductive trace, and a dielectric layer separating the signal conductor and ground plane, and are an effective approach to introducing a characteristic impedance at each transmission line 112 that meets the design objectives of the present invention.

Distributed Nature of Power Combiner

Another resulting characteristic of the present design is that the insertion loss is reduced as compared to conventional corporate or commercially-available power combiners. This is because the fourth (or last) power amplifier sees less insertion loss than all other power amplifiers.

Insertion loss is the loss of signal power resulting from the insertion of a device in a transmission line, and is usually expressed in decibels (dB). In other words, insertion loss is an expression of how much power is lost in the signal as it is passing through a component, or absorbed by the component. Any time an element, such as a coupling element 114, internodal matching section 116, or output matching section 118 is introduced to a circuit, some insertion loss in the signal due to absorption is expected. Return loss, on the other hand, is an expression of how much of a signal is reflected or sent back by components to the generating source, before the signal enters those components.

Power from the first power amplifier signal travels all the way to the load, or output port. However, this is only one quarter of the total combined output power in a four-way design. The characteristic impedances of the network topology ensure that as combined power increases at different nodes 122, the amount of signal power absorbed can be "distributed" across the entire network topology by decreasing along the way towards the output port. In other words, any losses due to absorption are offset by the increases in power at the different receiving nodes 122. In contrast, in a conventional power combiner all amplifier output signals see the same branched insertion loss, resulting in less stable amplifier performance.

The systems and methods of the present invention may be implemented in many different performance and design environments. For example, they may be implemented in conjunction with any type of high-power RF or microwave circuit in which power is to be combined (or divided). The present invention may itself be considered as a power amplifier system that includes a power combiner circuit 100, as well as a power combiner circuit 100 that is usable in a power amplifier system. Additionally, the present invention may be considered as part of a broader application, including radar transmitters, electronic warfare systems, testing applications, and any other system in which high-frequency power combining or dividing is desired. Therefore, it is to be understood that the present invention may further include system components and devices for implementing the power combiner circuit 100 in different hardware environments. For example, the present invention may be embodied or arranged on one or more printed circuit boards (PCBs), and may also include controller(s), CPUs, driver(s), heat sinks, and other components, assemblies, or sub-assemblies for functioning in the desired hardware environment.

The foregoing descriptions of embodiments of the present invention have been presented for the purposes of illustration and description. It is not intended to be exhaustive or to limit the invention to the precise forms disclosed. Accordingly, many alterations, modifications and variations are possible in light of the above teachings, may be made by those having ordinary skill in the art without departing from the spirit and scope of the invention. For example, the present invention may network topology 110 may have many different configurations and many different components. It is therefore intended that the scope of the invention be limited not by this detailed description. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

The invention claimed is:

1. A power combiner circuit, comprising:
a plurality of input ports, each input port receiving an input signal;
an impedance matching network topology configured between the plurality of input ports and an output port, including
a plurality of transmission lines between the plurality of input ports and the output ports,
a coupling element configured between each input port and a receiving node in a cascaded array of nodes,
a plurality of internodal matching sections, each matching section configured between receiving nodes in the cascaded array of nodes, and
an output matching section coupled between the output port and a last receiving node of the cascaded array of nodes,
the impedance matching network topology having a simultaneously-matched impedance condition between the input ports and the output port, achieved by a) calculating a current seen at each receiving node, and b) calculating an impedance of each coupling element, each internodal matching section, and the output matching section for a desired bandwidth, so that a load impedance at the output port is equal to an impedance seen at each input port; and
a phase shifting component configured at one or more of the input ports to adjust a difference in signal phase between each input signal at each input port, so that the input signal seen at each receiving node has the same signal phase.

2. The power combiner circuit of claim 1, wherein the plurality of transmission lines each have an electrical length of a quarter wavelength, wherein the electrical length of each transmission line and the impedance of each coupling element, each internodal matching section, and the output matching section are configured for a desired frequency range of a power amplifier to achieve the desired bandwidth.

3. The power combiner circuit of claim 1, wherein each transmission line has an electrical length of approximately 90 degrees.

4. The power combiner circuit of claim 1, wherein each input port receives an input signal from a power amplifier.

5. The power combiner circuit of claim 1, wherein each input port receives an input signal from a monolithic microwave integrated circuit.

6. The power combiner circuit of claim 1, wherein the impedance seen at the last receiving node is a value of the incoming impedance divided by a total number of input ports.

7. The power combiner circuit of claim 1, wherein the impedance matching network topology includes one or more lumped circuit elements at each transmission line.

8. The power combiner circuit of claim 1, wherein the impedance matching network topology is comprised of microstrip transmission lines.

9. The power combiner circuit of claim 1, wherein the impedance matching network topology is comprised of stripline transmission lines.

10. The power combiner circuit of claim 1, wherein the impedance matching network topology is comprised of coaxial transmission lines.

11. The power combiner circuit of claim 1, wherein the impedance matching network topology is comprised of waveguide transmission lines.

12. The power combiner circuit of claim 1, wherein the phase shifting component includes one or more delay elements configured at one or more of the input ports.

13. The power combiner circuit of claim 1, wherein the phase shifting component includes an input splitter circuit.

14. The power combiner circuit of claim 13, wherein the input splitter circuit includes an input matching network topology that has the same configuration as the impedance matching network topology.

15. The power combiner circuit of claim 1, wherein the output matching section includes a plurality of circuit elements introducing a characteristic impedance to the impedance matching network topology.

16. The power combiner circuit of claim 1, wherein the load impedance at the output port and the impedance seen at each input port are 50 Ohms.

17. A method, comprising:
receiving an input signal at a plurality of input ports, wherein each input signal is an output of an integrated circuit;
simultaneously matching an impedance condition across a network topology between the plurality of input ports and an output port, the network topology comprised of a plurality of transmission lines, a coupling element configured between each input port and a receiving node in a cascaded array of nodes, a plurality of internodal matching sections each configured between receiving nodes in the cascaded array of nodes, and an output matching section coupled between the output port and a last receiving node of the cascaded array of nodes, by calculating a current seen at each receiving node, and calculating an impedance of each coupling element, each internodal matching section, and the output matching section for a desired bandwidth, so that a load impedance at the output port is equal to an impedance seen at each input port; and adjusting a difference in signal phase between each input signal at each input port, so that the input signal seen at each receiving node has the same signal phase.

18. The method of claim 17, wherein each input signal at each input port provided as an output of a monolithic microwave integrated circuit.

19. The method of claim 17, further comprising configuring the plurality of transmission lines to each have an electrical length of a quarter wavelength, so that the electrical length of each transmission line and the impedance of each coupling element, each internodal matching section, and the output matching section are configured for a desired frequency range of a power amplifier to achieve the desired bandwidth.

20. The method of claim 17, further comprising configuring each transmission line in the plurality of transmission to have an electrical length of approximately 90 degrees.

21. The method of claim 17, wherein the impedance seen at the last receiving node is a value of the incoming impedance divided by a total number of input ports.

22. The method of claim 17, wherein the impedance matching network topology includes one or more lumped circuit elements at each transmission line.

23. The method of claim 17, wherein the impedance matching network topology is comprised of microstrip transmission lines.

24. The method of claim 17, wherein the impedance matching network topology is comprised of stripline transmission lines.

25. The method of claim 17, wherein the impedance matching network topology is comprised of coaxial transmission lines.

26. The method of claim 17, wherein the impedance matching network topology is comprised of waveguide transmission lines.

27. The method of claim 17, wherein the adjusting a difference in signal phase is performed by one or more delay elements configured at one or more of the input ports.

28. The method of claim 27, wherein the phase shifting component includes at least one phase shifter circuit.

29. The method of claim 27, wherein the phase shifting component includes at least one 90-degree hybrid coupler circuit.

30. The method of claim 17, wherein the phase shifting component includes an input splitter circuit.

31. The method of claim 30, wherein the input splitter circuit includes an input matching network topology that has the same configuration as the impedance matching network topology.

32. The method of claim 17, wherein the output matching section includes a plurality of circuit elements introducing a characteristic impedance to the impedance matching network topology.

33. The method of claim 17, wherein the load impedance at the output port and the impedance seen at each input port are 50 Ohms.

* * * * *